US012672543B2

(12) United States Patent
Hsieh et al.

(10) Patent No.: US 12,672,543 B2
(45) Date of Patent: Jun. 30, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Ping-Yin Hsieh, Hsinchu (TW); Chih-Hao Chen, Taipei City (TW); Yi-Huan Liao, Hsinchu (TW); Pu Wang, Hsinchu (TW); Li-Hui Cheng, New Taipei City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 808 days.

(21) Appl. No.: 17/815,629

(22) Filed: Jul. 28, 2022

(65) Prior Publication Data

US 2024/0038623 A1     Feb. 1, 2024

(51) Int. Cl.
| | |
|---|---|
| *H10W 40/25* | (2026.01) |
| *H10W 40/22* | (2026.01) |
| *H10W 70/02* | (2026.01) |
| *H10W 70/05* | (2026.01) |
| *H10W 70/63* | (2026.01) |
| *H10W 74/01* | (2026.01) |

(Continued)

(52) U.S. Cl.
CPC ......... *H10W 40/255* (2026.01); *H10W 40/22* (2026.01); *H10W 70/02* (2026.01); *H10W 70/093* (2026.01); *H10W 70/095* (2026.01); *H10W 70/635* (2026.01); *H10W 74/012*

(2026.01); *H10W 74/016* (2026.01); *H10W 74/117* (2026.01); *H10W 74/121* (2026.01); *H10W 74/15* (2026.01)

(58) Field of Classification Search
CPC ............. H01L 23/3735; H01L 21/4853; H01L 21/486; H01L 21/4871; H10W 40/255; H10W 40/22; H10W 70/02; H10W 70/093; H10W 70/095; H10W 70/635; H10W 74/012; H10W 74/016; H10W 74/117; H10W 74/121; H10W 74/15; H10W 90/00; H10W 90/701; H10W 40/258

See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |

(Continued)

FOREIGN PATENT DOCUMENTS

| | | |
|---|---|---|
| CN | 201501257 A | 1/2015 |
| TW | 202205571 A | 2/2022 |

*Primary Examiner* — Ratisha Mehta
(74) *Attorney, Agent, or Firm* — Slater Matsil, LLP

(57) ABSTRACT

In an embodiment, a device includes a package component including an integrated circuit die and conductive connectors connected to the integrated circuit die, the conductive connectors disposed at a front-side of the package component. The device also includes a back-side metal layer on a back-side of the package component. The device also includes an indium thermal interface material on a back-side of the back-side metal layer. The device also includes a lid on a back-side of the indium thermal interface material. The device also includes a package substrate connected to the conductive connectors, the lid being adhered to the package substrate.

20 Claims, 19 Drawing Sheets

(51) Int. Cl.
    *H10W 74/10*     (2026.01)
    *H10W 74/15*     (2026.01)

(56)                  References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,626,344 B2 | 4/2023 | Chen et al. | |
| 12,062,592 B2 * | 8/2024 | Chan Arguedas | H01L 23/433 |
| 2006/0128068 A1 * | 6/2006 | Murray | H01L 21/4882 |
| | | | 438/120 |
| 2020/0098666 A1 * | 3/2020 | Wan | H01L 23/367 |
| 2020/0161275 A1 | 5/2020 | Lin et al. | |
| 2020/0411395 A1 | 12/2020 | Bozorg-Grayeli et al. | |
| 2021/0384100 A1 * | 12/2021 | Ryu | H01L 24/33 |
| 2024/0066814 A1 * | 2/2024 | Yu | B29C 45/14811 |
| 2025/0256363 A1 * | 8/2025 | Kawanago | B23K 35/362 |

* cited by examiner

INTEGRATED CIRCUIT PACKAGES AND METHODS OF FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
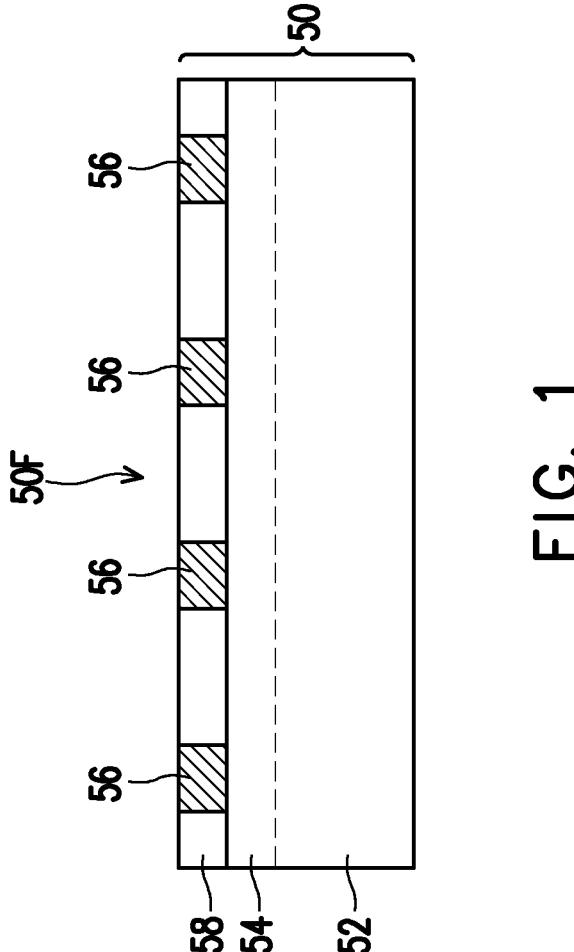
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, integrated circuit packages are formed by packaging integrated circuit dies in a wafer. The wafer is singulated to form intermediate package components. The package components are then attached to package substrates to form the integrated circuit packages. In some embodiments, after the package components attached to the package substrates, lids with integrated heat dissipation structures are simultaneously attached to the package components and the package substrates. The integrated heat dissipation structure may be formed by a plating process on the lid and may comprise indium. By integrating an indium heat dissipation structure into the lid, the structure has improved reliability because there are no gold-containing intermetallic compounds (IMCs) between the indium heat dissipation structure and the lid. If used, gold-containing IMCs can crack during subsequent processing or during usage of the package. Further, in some embodiments, the indium heat dissipation structure is formed to have gaps or recesses outside of the area where the structure overlies an integrated circuit die. These gaps or recesses in the indium heat dissipation structure can reduce the stress in the packages and improve the reliability.

FIG. 1 is a cross-sectional view of an integrated circuit die 50. Integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobutene (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front-side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front-side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are substantially coplanar (within process variations) such that they are level with one another. The die connectors 56 and the dielectric layer 58 are exposed at the front-side 50F of the integrated circuit die 50.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 54.

FIGS. 2-11 are views of intermediate stages in the manufacturing of integrated circuit packages 200, in accordance with some embodiments. FIGS. 2-11 are cross-sectional views and a plan view of a process for forming package components 210 which include interposers, such as package components for chip-on-wafer-on-substrate (CoWoS®) devices. The package components 210 may be chip-on-wafer (CoW) package components.

The integrated circuit packages 200 (see FIG. 11) will be formed by initially packaging integrated circuit dies 50 to form package components 210 in a wafer 100. One package region 100A of the wafer 100 is illustrated, and integrated circuit dies 50 are packaged to form a package component 210 in each of the package regions 100A of the wafer 100. It should be appreciated that any quantity of package regions can be simultaneously processed to form any quantity of package components. The package regions 100A of the wafer 100 will be singulated to form the package components 210. The package components 210 will be attached to package substrates 220 (see e.g., FIG. 8 or 12). Heat dissipation structures 212/232/230 will then be formed on the package components 210 and package substrates 220 to complete formation of the integrated circuit packages 200 (see e.g., FIG. 11 or 17).

Figure 2:
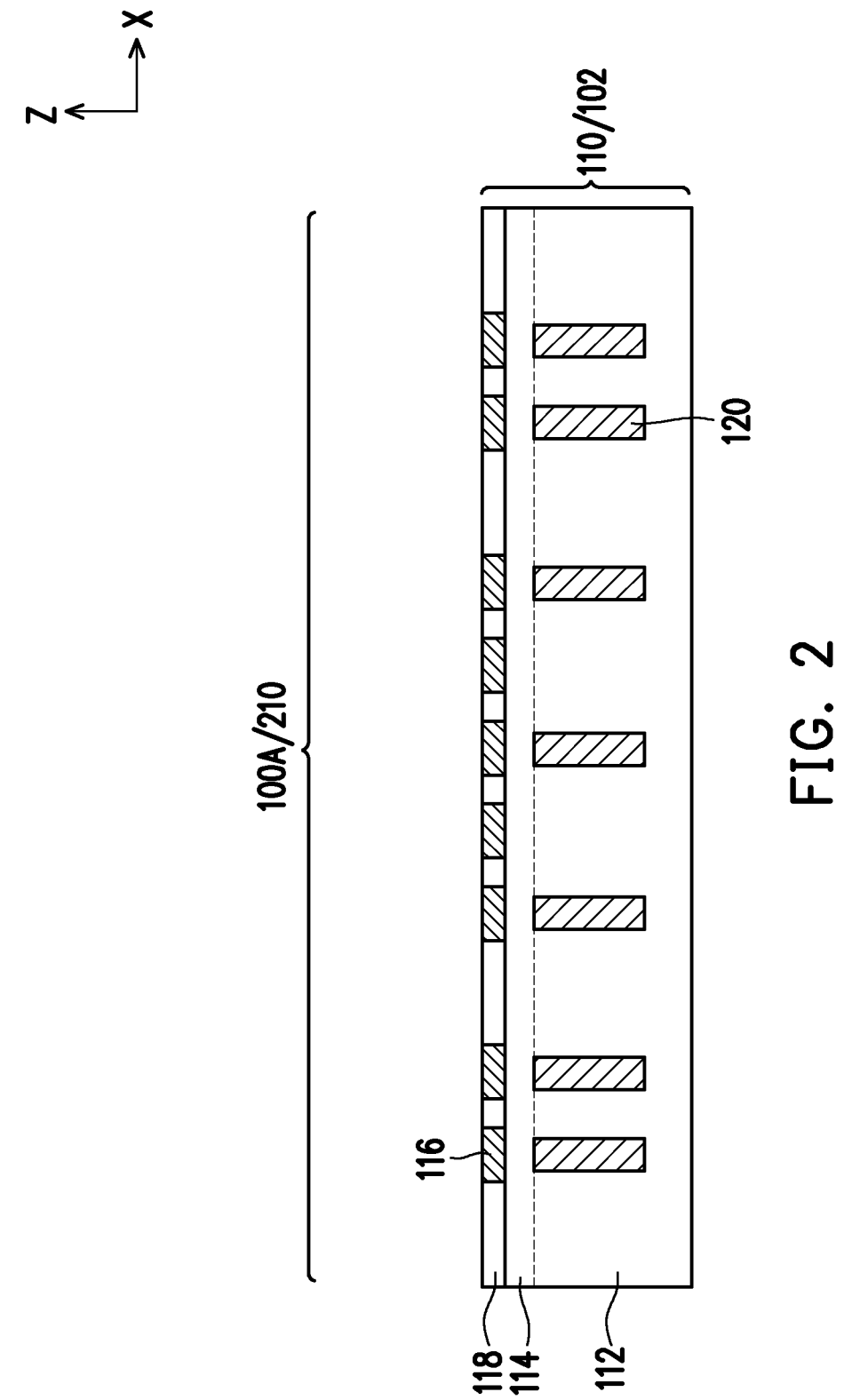
FIGS. 2, 3, 4, 5, 6, 7, 8, 9A, 9B, 10, and 11 are views of intermediate stages in the manufacturing of integrated circuit packages, in accordance with some embodiments.

In FIG. 2, a wafer 110 is obtained or formed. The wafer 110 comprises devices in a package region 100A, which will be singulated in subsequent processing to be included in the package component 210. The devices in the wafer 110 may be interposers, integrated circuit dies, or the like. In some embodiments, interposers 102 are formed in the wafer 110, which include a substrate 112, an interconnect structure 114, and conductive vias 120.

The substrate 112 may be a bulk semiconductor substrate, a semiconductor-on-insulator (SOI) substrate, a multi-layered semiconductor substrate, or the like. The substrate 112 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 112 may be doped or undoped. In embodiments where interposers are formed in the wafer 110, the substrate 112 generally does not include active devices therein, although the interposers may include passive devices formed in and/or on a front surface (e.g., the surface facing upward in FIG. 2) of the substrate 112. In embodiments where integrated circuit devices are formed in the wafer 110, active devices such as transistors, capacitors, resistors, diodes, and the like, may be formed in and/or on the front surface of the substrate 112.

The interconnect structure 114 is over the front surface of the substrate 112, and is used to electrically connect the devices (if any) of the substrate 112. The interconnect structure 114 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobutene (BCB) based polymer, or the like. The metallization layer(s) may include conductive vias and/or conductive lines to interconnect any devices together and/or to an external device. The metallization layer(s) may be formed of a conductive material, such as a metal, such as copper, cobalt, aluminum, gold, combinations thereof, or the like. The interconnect structure 114 may be formed by a damascene process, such as a single damascene process, a dual damascene process, or the like.

In some embodiments, die connectors 116 and a dielectric layer 118 are at the front-side of the wafer 110. Specifically, the wafer 110 may include die connectors 116 and a dielectric layer 118 that are similar to those of the integrated circuit die 50 described for FIG. 1. For example, the die connectors 116 and the dielectric layer 118 may be part of an upper metallization layer of the interconnect structure 114.

The conductive vias 120 extend into the interconnect structure 114 and/or the substrate 112. The conductive vias 120 are electrically connected to metallization layer(s) of the interconnect structure 114. The conductive vias 120 are also sometimes referred to as through substrate vias (TSVs). As an example to form the conductive vias 120, recesses can be formed in the interconnect structure 114 and/or the substrate 112 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 114 or the substrate 112 by, for example, a CMP. Remaining portions of the barrier layer and conductive material form the conductive vias 120.

Figure 3:
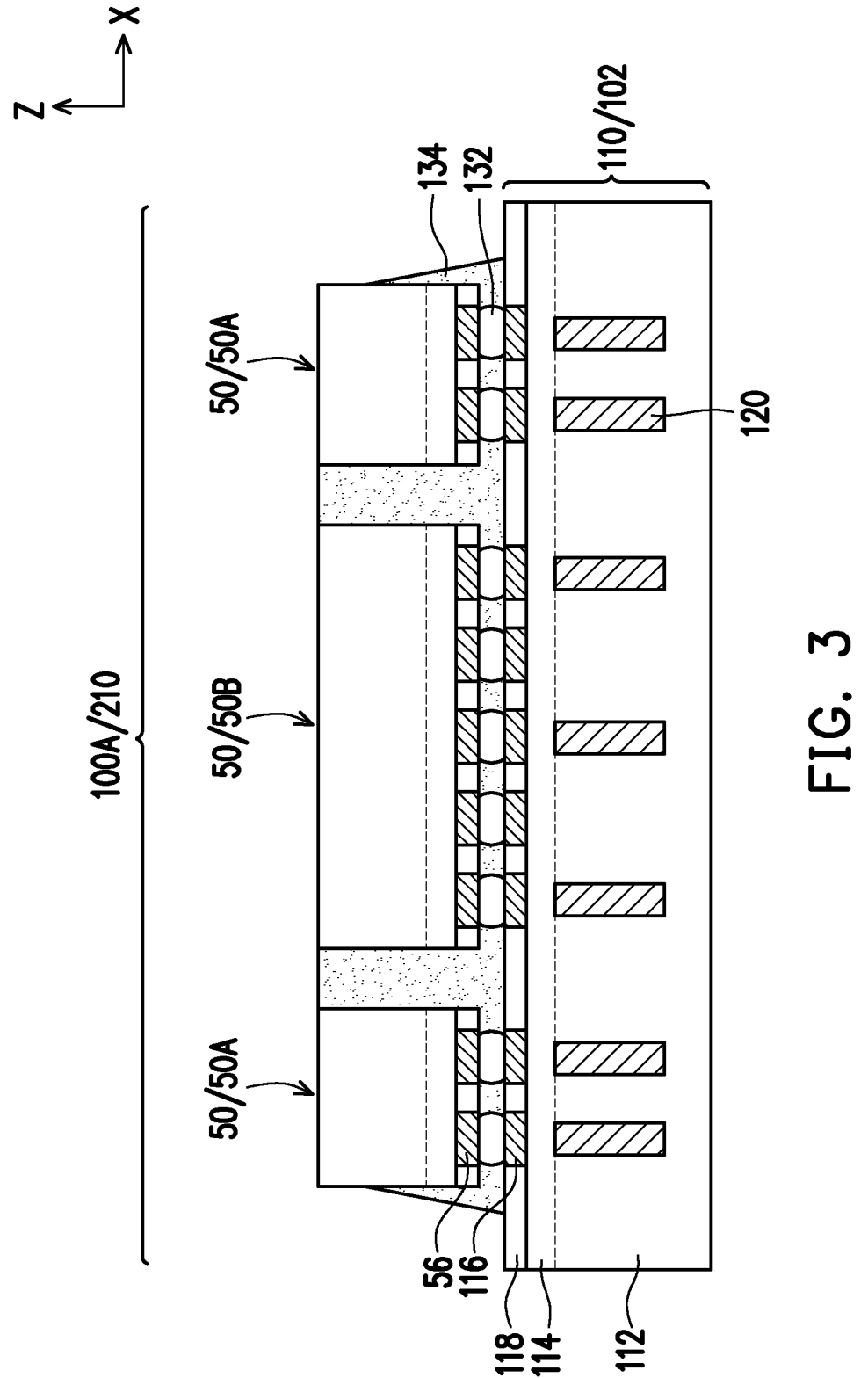

In FIG. 3, integrated circuit dies 50 (e.g., a first integrated circuit die 50A and a plurality of second integrated circuit dies 50B) are attached to the wafer 110. In the embodiment shown, multiple integrated circuit dies 50 are placed adjacent one another, including the first integrated circuit die 50A and the second integrated circuit dies 50B, where the first integrated circuit die 50A is between the second integrated circuit dies 50B. In some embodiments, the first integrated circuit die 50A is a logic device, such as a CPU, GPU, or the like, and the second integrated circuit dies 50B are memory devices, such as DRAM dies, HMC modules, HBM modules, or the like. In some embodiments, the first integrated circuit die 50A is the same type of device (e.g., SoCs) as the second integrated circuit dies 50B.

In the illustrated embodiment, the integrated circuit dies 50 are attached to the wafer 110 with solder bonds, such as with conductive connectors 132. The integrated circuit dies 50 may be placed on the interconnect structure 114 using, e.g., a pick-and-place tool. The conductive connectors 132 may be formed of a conductive material that is reflowable, such as solder, copper, aluminum, gold, nickel, silver, palladium, tin, the like, or a combination thereof. In some embodiments, the conductive connectors 132 are formed by initially forming a layer of solder through methods such as evaporation, electroplating, printing, solder transfer, ball placement, or the like. Once a layer of solder has been formed on the structure, a reflow may be performed in order to shape the conductive connectors 132 into desired bump shapes. Attaching the integrated circuit dies 50 to the wafer 110 may include placing the integrated circuit dies 50 on the wafer 110 and reflowing the conductive connectors 132. The conductive connectors 132 form joints between corresponding die connectors 116 of the wafer 110 and die connectors 56 the integrated circuit dies 50, electrically connecting the interposer 102 to the integrated circuit dies 50.

An underfill 134 may be formed around the conductive connectors 132, and between the wafer 110 and the integrated circuit dies 50. The underfill 134 may reduce stress and protect the joints resulting from the reflowing of the conductive connectors 132. The underfill 134 may be formed of an underfill material such as a molding compound, epoxy, or the like. The underfill 134 may be formed by a capillary flow process after the integrated circuit dies 50 are attached to the wafer 110, or may be formed by a suitable deposition method before the integrated circuit dies 50 are attached to the wafer 110. The underfill 134 may be applied in liquid or semi-liquid form and then subsequently cured.

In other embodiments (not separately illustrated), the integrated circuit dies 50 are attached to the wafer 110 with direct bonds. For example, hybrid bonding, fusion bonding, dielectric bonding, metal bonding, or the like may be used to directly bond corresponding dielectric layers 58, 118 and/or die connectors 56, 116 of the integrated circuit dies 50 and the wafer 110 without the use of adhesive or solder. The underfill 134 may be omitted when direct bonding is used. Further, a mix of bonding techniques could be used, e.g., some integrated circuit dies 50 could be attached to the wafer 110 by solder bonds, and other integrated circuit dies 50 could be attached to the wafer 110 by direct bonds.

Figure 4:
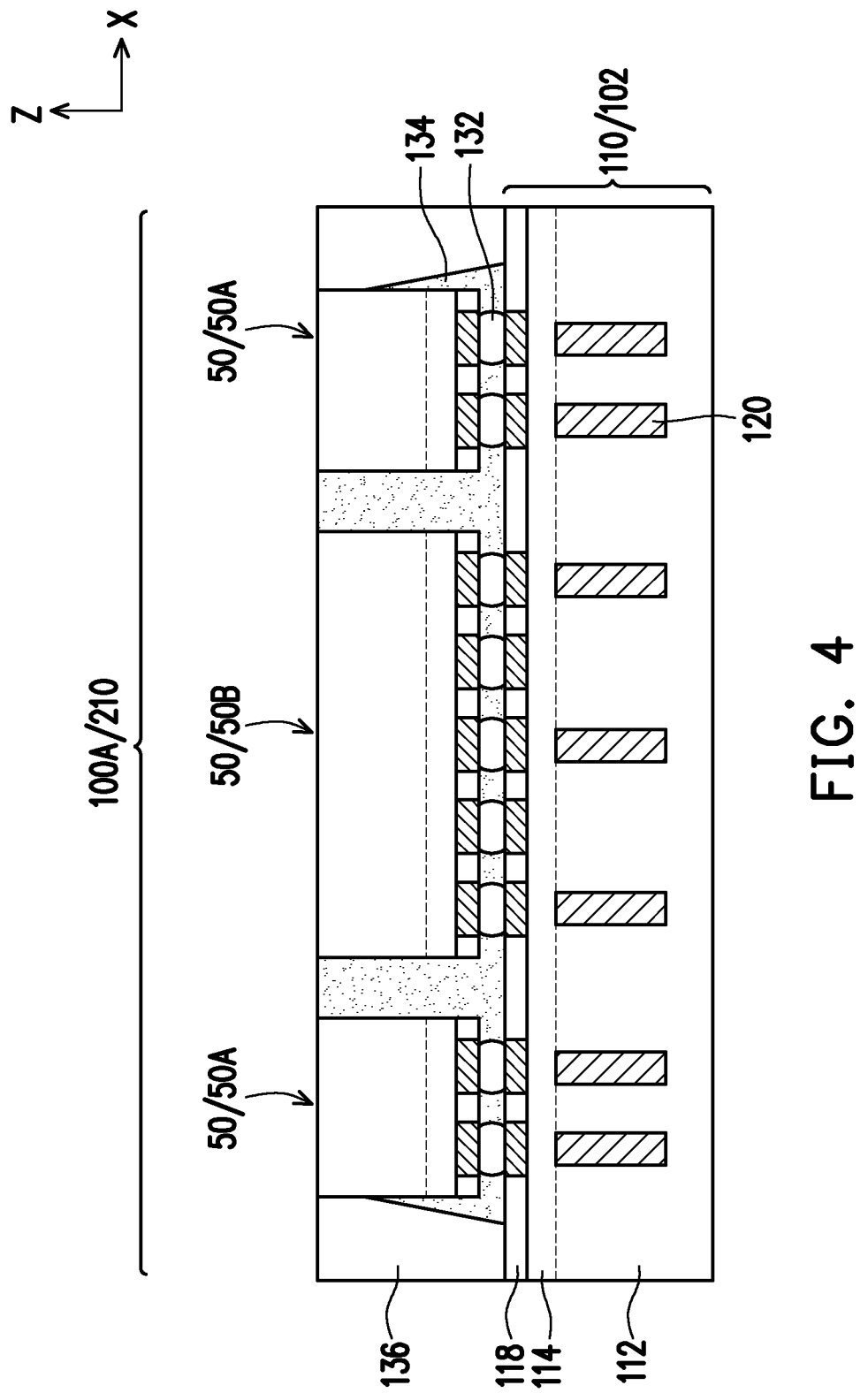

In FIG. 4, an encapsulant 136 is formed on and around the integrated circuit dies 50. After formation, the encapsulant 336 encapsulates the integrated circuit dies and the underfill 134 (if present) or the conductive connectors 132. The encapsulant 136 may be a molding compound, epoxy, or the like. The encapsulant 136 may be applied by compression molding, transfer molding, or the like, and is formed over the wafer 110 such that the integrated circuit dies 50 are buried or covered. The encapsulant 136 may be applied in liquid or semi-liquid form and then subsequently cured. The encapsulant 136 may be thinned to expose the integrated circuit dies 50. The thinning process may be a grinding process, a chemical-mechanical polish (CMP), an etch-back, combinations thereof, or the like. After the thinning process, the top surfaces of the integrated circuit dies 50 and the encapsulant 136 are coplanar (within process variations) such that they are level with one another. The thinning is performed until a desired amount of the integrated circuit dies 50 and/or the encapsulant 136 has been removed.

Figure 5:
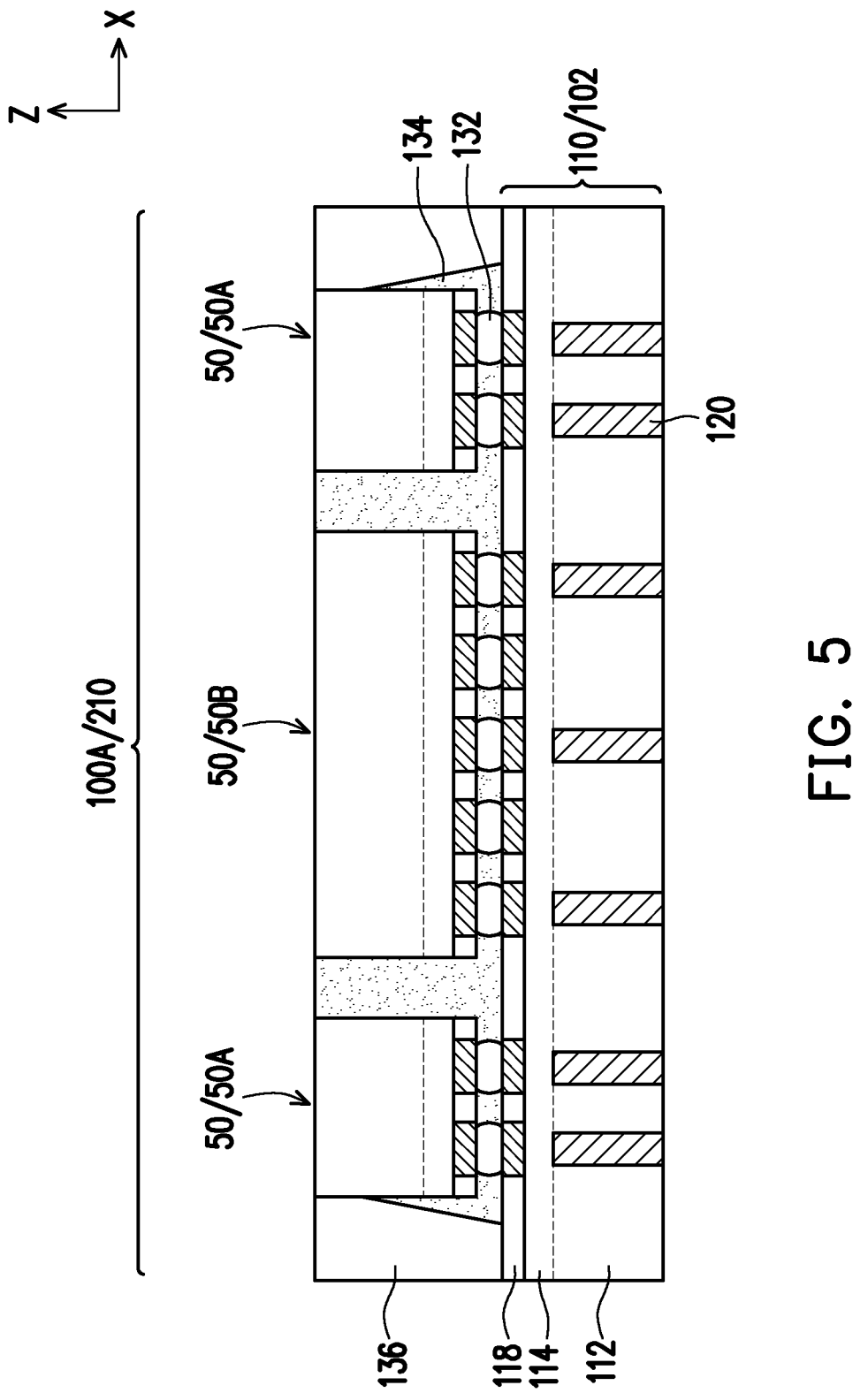

In FIG. 5, the substrate 112 is thinned to expose the conductive vias 130. Exposure of the conductive vias 130 may be accomplished by a thinning process, such as a grinding process, a chemical-mechanical polish (CMP), an etch-back, combinations thereof, or the like. In some embodiments (not separately illustrated), the thinning process for exposing the conductive vias 130 includes a CMP, and the conductive vias 130 protrude at the back-side of the wafer 110 as a result of dishing that occurs during the CMP. In such embodiments, an insulating layer (not separately illustrated) may optionally be formed on the back surface of the substrate 112, surrounding the protruding portions of the conductive vias 130. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. After the substrate 112 is thinned, the exposed surfaces of the conductive vias 130 and the insulating layer (if present) or the substrate 112 are coplanar (within process variations) such that they are level with one another, and are exposed at the back-side of the wafer 110.

Figure 6:
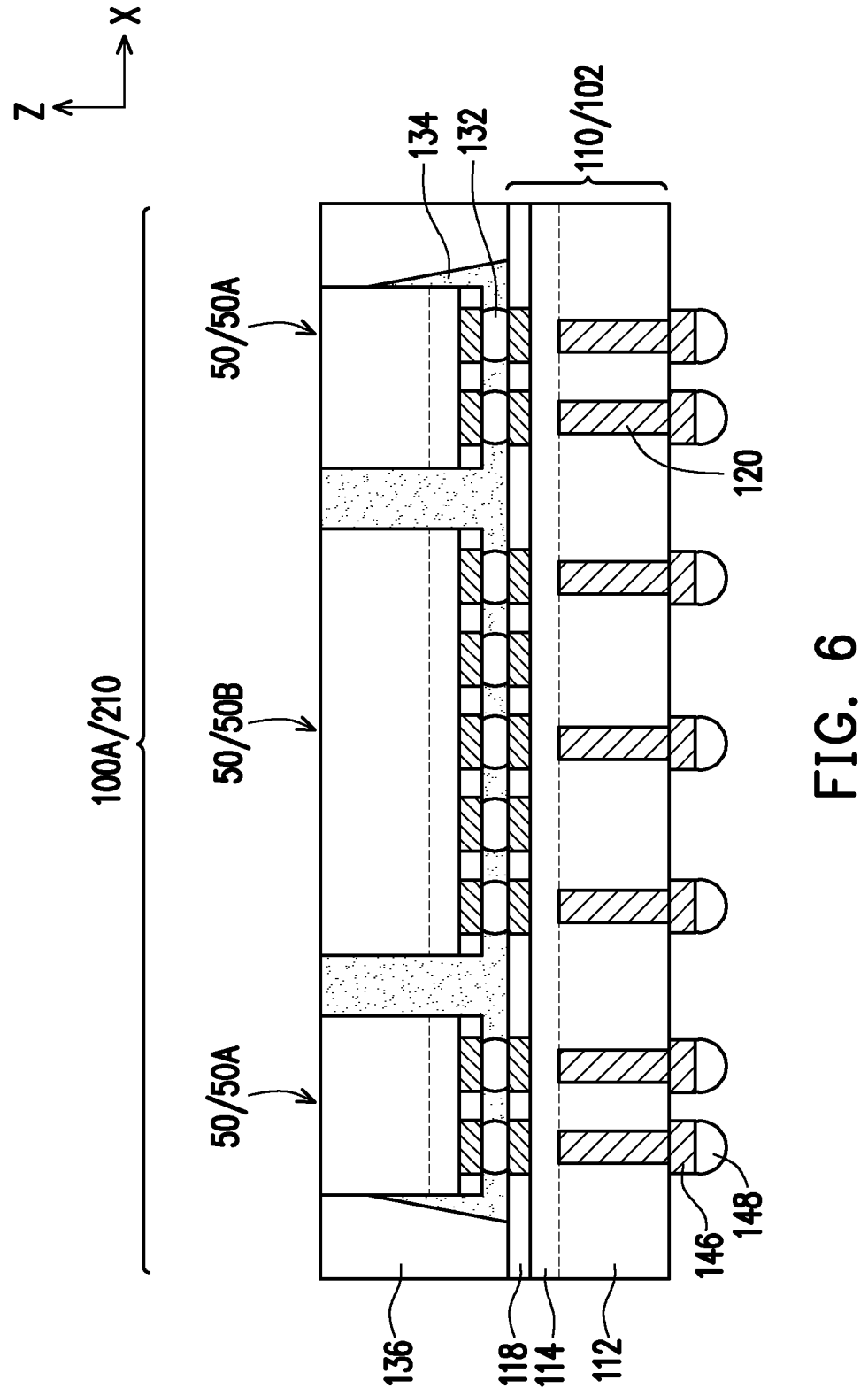

In FIG. 6, UBMs 146 are formed on the exposed surfaces of the conductive vias 130 and the substrate 112. As an example to form the UBMs 146 in this embodiment, a seed layer (not separately illustrated) is formed over the exposed surfaces of the conductive vias 130 and the substrate 112. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 146. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 146.

Further, conductive connectors 148 are formed on the UBMs 146. The conductive connectors 148 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 148 may include a conductive material such as solder, copper, aluminum, gold, nickel, silver, palladium, tin, the like, or a combination thereof. In some embodiments, the conductive connectors 148 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 148 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 7:
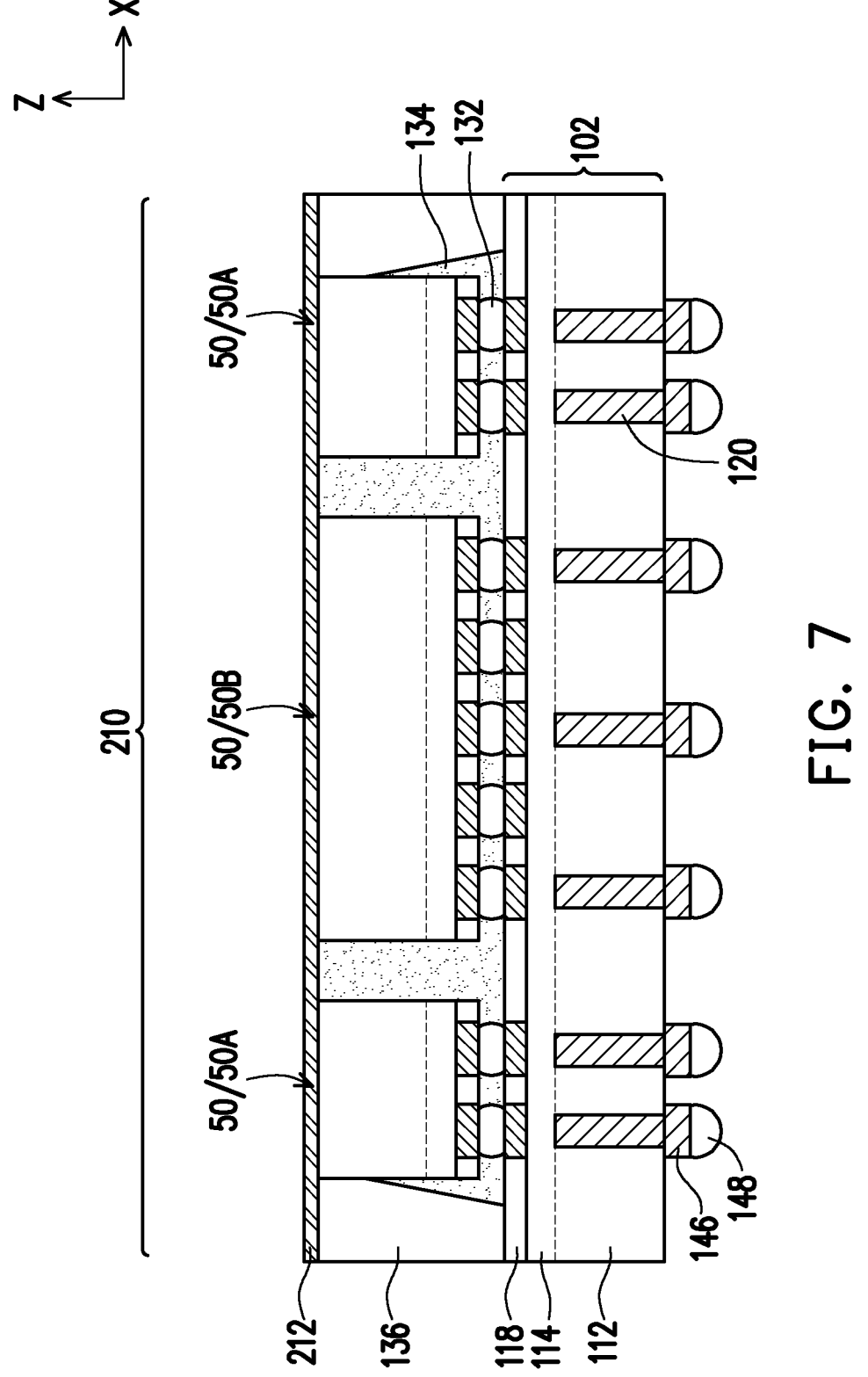

In FIG. 7, back-side metal 212 is formed along the back-side surface of the package component 210. The back-side metal 212 is formed of one or more layers. The back-side metal 212 may include multiple layers with each layer having different compositions and functionalities, such as, an adhesion layer, a diffusion blocking layer, and an anti-oxidation layer. In some embodiments, at least one of the layers is formed of a material with high thermal conductivity. The one or more layers of the back-side metal 212 may be formed of a metal or metal nitride, such as such as aluminum, titanium, titanium nitride, nickel, nickel vanadium, silver, gold, copper, combinations thereof, or the like, which may be conformally formed by a PVD process such as sputtering or evaporation, a plating process such as electroless plating or electroplating, a printing process such as inkjet printing, or the like. The back-side metal 212 will subsequently be singulated so that each package component 210 includes a portion of the back-side metal 212.

Although the back-side metal 212 is illustrated as being formed after the conducive connectors 148, in some embodiments, the back-side metal 212 may be formed before the conductive connectors 148.

Further, a singulation process is performed by cutting along scribe line regions, e.g., around the package region 100A. The singulation process may include sawing, dicing, or the like. For example, the singulation process can include sawing the encapsulant 136, the interconnect structure 114, and the substrate 112. The singulation process singulates the package region 100A from adjacent package regions. The resulting, singulated package component 210 is from the package region 100A. The singulation process forms interposers 102 from the singulated portions of the wafer 110. As a result of the singulation process, the outer sidewalls of the interposer 102, the back-side metal 212, and the encapsulant 136 are laterally coterminous (within process variations).

FIGS. 8, 9A, 9B, 10, and 11 illustrate various additional steps in the manufacturing of embodiment packages. The package components 210 will be attached to package substrates 220 (see FIG. 11), thus completing formation of the integrated circuit packages 200. A single package component 210, a single package substrate 220, and a single integrated circuit package 200 are illustrated. It should be appreciated that multiple package components can be simultaneously processed to form multiple integrated circuit packages 200.

Figure 8:
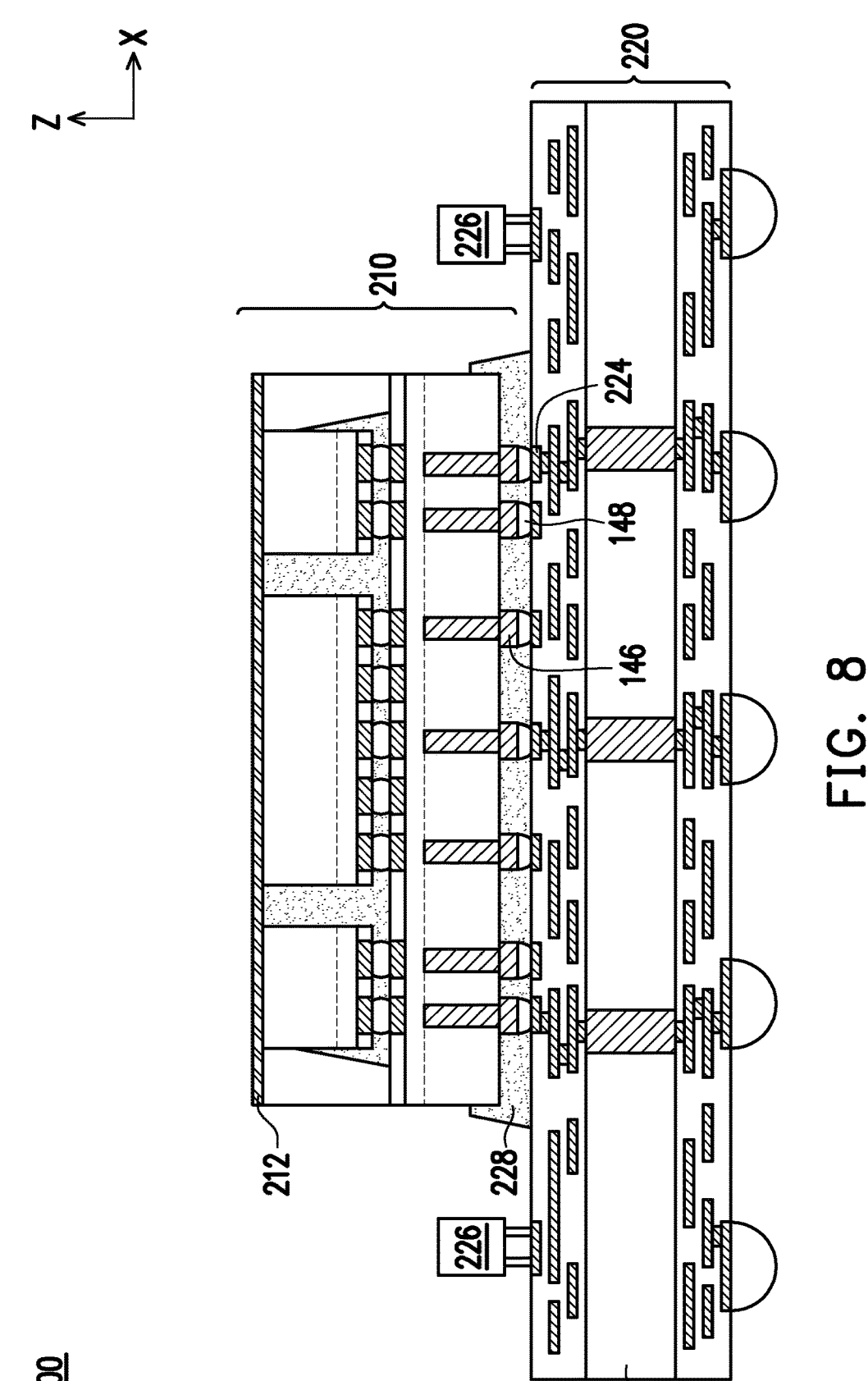

In FIG. 8, a package component 210 is attached to a package substrate 220 using the conductive connectors 148. The package substrate 220 includes a substrate core 222, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 222 may be a SOI substrate. Generally, an SOI substrate includes a layer of a semiconductor material such as epitaxial silicon, germanium, silicon germanium, SOI, SGOI, or combinations thereof. In another embodiment, the substrate core 222 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate core 222.

The substrate core 222 may include active and passive devices (not separately illustrated). Devices such as transistors, capacitors, resistors, combinations thereof, and the like may be used to generate the structural and functional requirements of the design for the system. The devices may be formed using any suitable methods.

The substrate core 222 may also include metallization layers and vias, and bond pads 224 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, or the like). In some embodiments, the substrate core 222 is substantially free of active and passive devices.

The conductive connectors 148 are reflowed to attach the UBMs 146 to the bond pads 224. The conductive connectors 148 connect the package component 210, including the metallization layers 144 of the redistribution structure 140, to the package substrate 220, including metallization layers of the substrate core 222. Thus, the package substrate 220 is electrically connected to the integrated circuit dies 50. In some embodiments, passive devices (e.g., surface mount devices (SMDs), not separately illustrated) may be attached to the package component 210 (e.g., bonded to the UBMs 146) prior to mounting on the package substrate 220. In such embodiments, the passive devices may be bonded to a same surface of the package component 210 as the conductive connectors 148. In some embodiments, passive devices 226 (e.g., SMDs) may be attached to the package substrate 220, e.g., to the bond pads 224.

In some embodiments, an underfill 228 is formed between the package component 210 and the package substrate 220, surrounding the conductive connectors 148. The underfill 228 may be formed by a capillary flow process after the package component 210 is attached or may be formed by any suitable deposition method before the package component 210 is attached. The underfill 228 may be a continuous material extending from the package substrate 220 to the substrate 112.

Figure 9A:
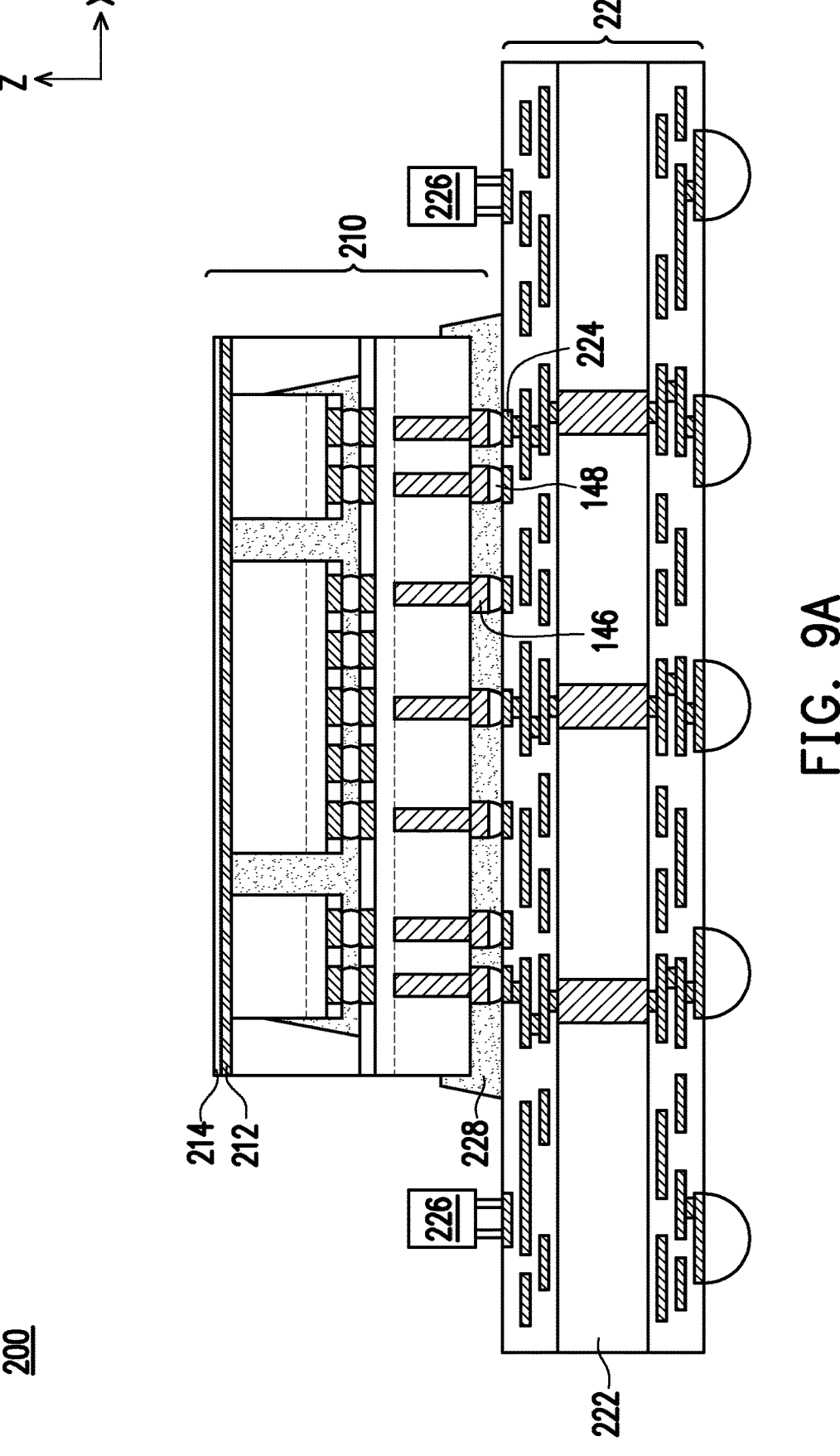
Figure 9B:
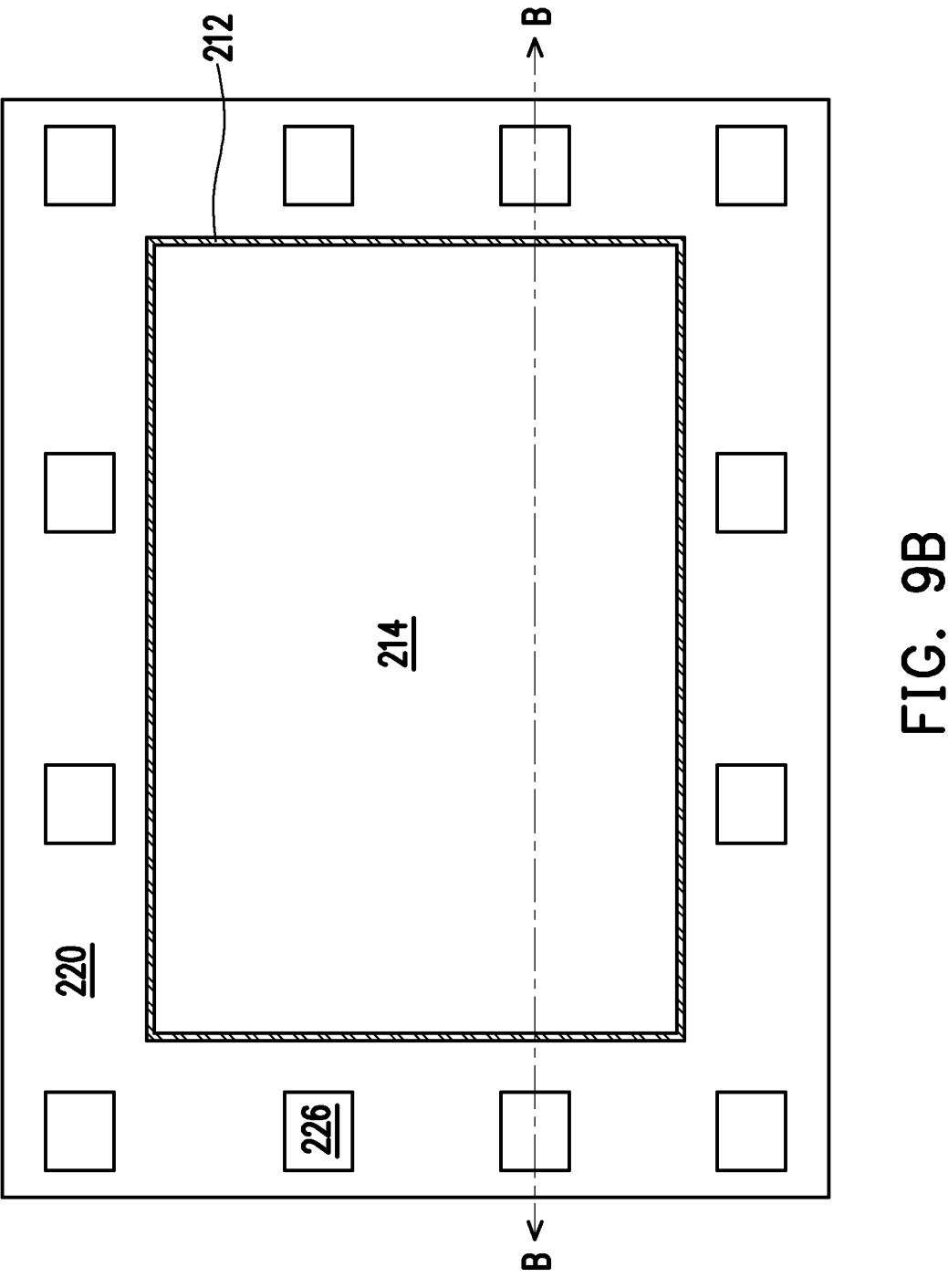

In FIGS. 9A and 9B, the back-side metal 212 is coated with a flux 214. In some embodiments, the flux 214 is a no-clean flux. The flux 214 may be jetted onto the back-side metal 212. As shown in the plan view of FIG. 9B, the flux 214 substantially covers the back-side metal 212 (within process variations). In another embodiment (subsequently described in FIGS. 12-17), the flux 214 does not substantially cover the back-side metal 212.

Figure 10:
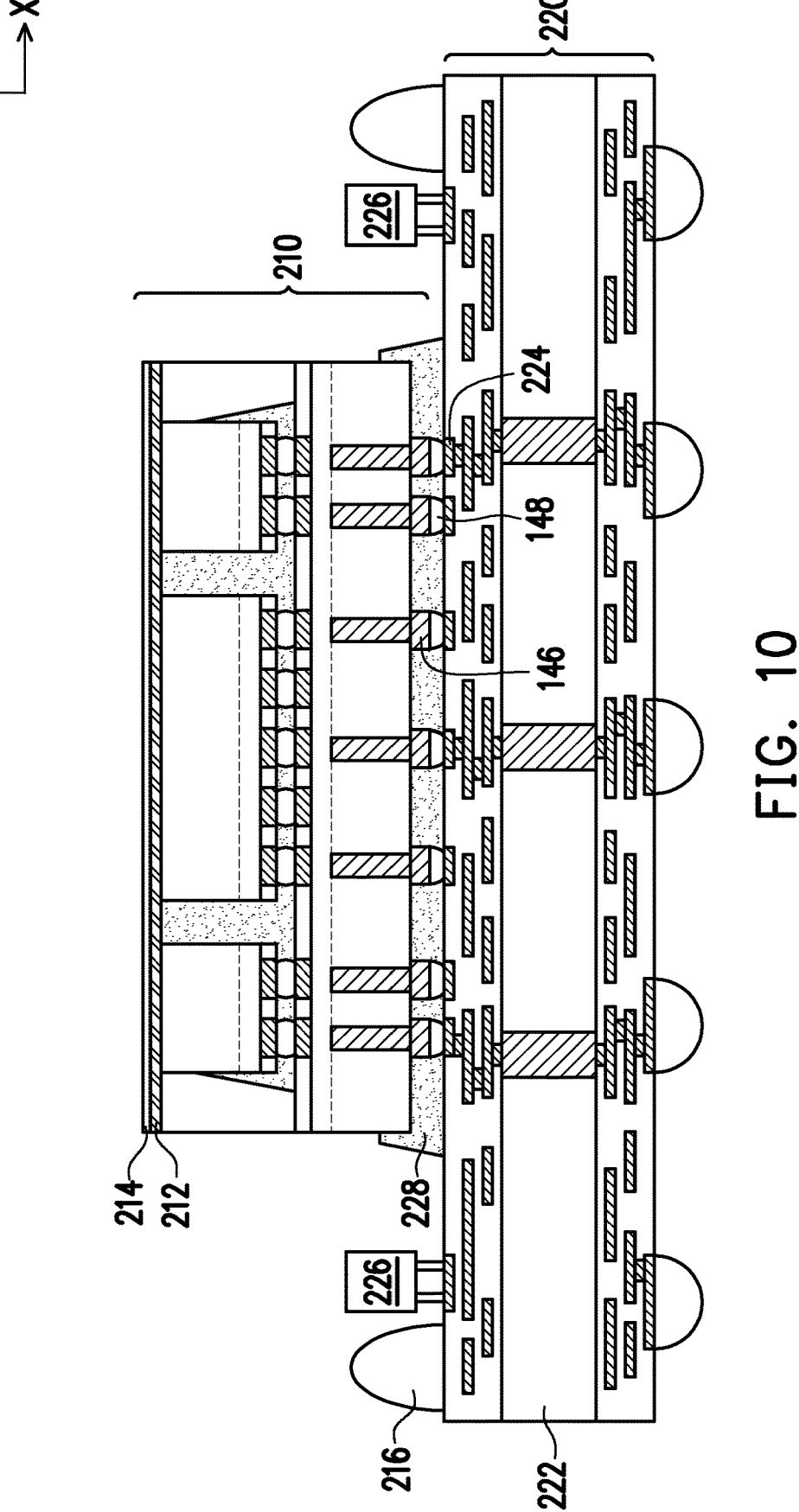

In FIG. 10, an adhesive 216 is formed on the package substrate 220 to subsequently adhere a lid 230 (see FIG. 11) to the package substrate 220. The adhesive 216 may be a thermal interface material (TIM), a die attach film (DAF), or the like. For example, the adhesive 216 may be formed of a TIM such as a solder paste, a polymeric material, or the like, which may be dispensed on the package substrate 220 and/or on the lid 230. The lid 230 may also be attached to the package substrate 220 by other techniques.

Figure 11:
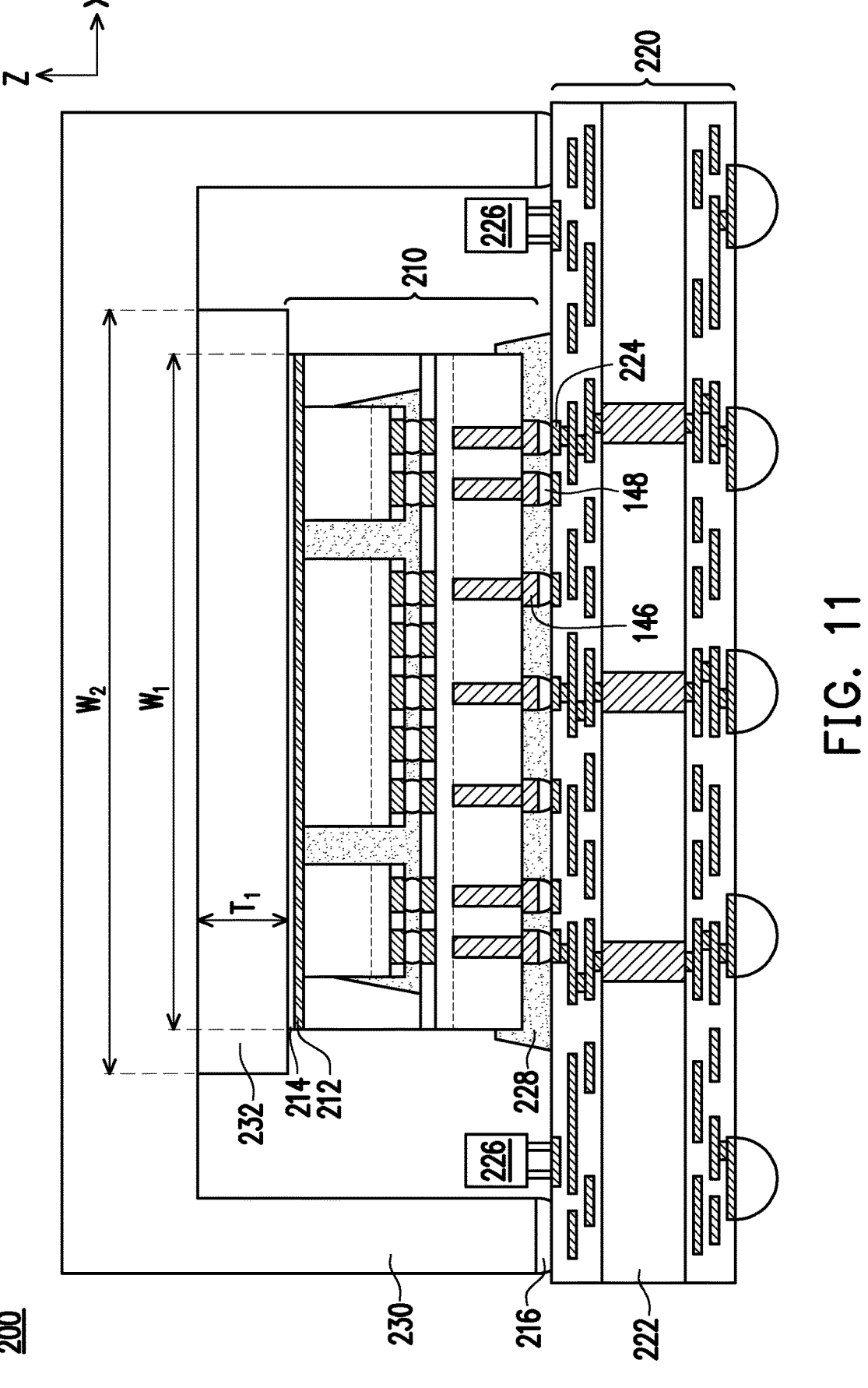

In FIG. 11, a lid 230 with an integrated thermal interface material (TIM) 232 is attached to the package component 210 and the package substrate 220. The lid 230 may be a thermal lid, a heatsink, or the like. In the illustrated embodiment, the lid 230 is a thermal lid which is also attached to the package substrate 220. A recess is in the bottom of the thermal lid so that the thermal lid can cover the package component 210. In some embodiments where the lid 230 is a thermal lid, the thermal lid can also cover the passive devices 226.

The TIM 232 is formed in the recess of the lid 230. In some embodiments, the TIM 232 comprises indium or alloys thereof. The TIM 232 may be formed on the lid 230 before the lid is attached to the package component 210 or the package substrate 220. In some embodiments, the TIM 232 is formed by a PVD process such as sputtering or evaporation, a plating process such as electroless plating or electroplating, or the like. The TIM 232 may be formed to have a thickness $T_1$ in the range of 10 μm to 1000 μm, such as 100 μm. In some embodiments, the TIM 232 is thicker than the back-side metal 212. The TIM 232 may be formed to have a width $W_2$ that is larger than a width $W_1$ of the package component 210. In some embodiments, the width $W_2$ is larger than the width $W_1$ by a range of 1 mm to 10 mm.

By integrating an indium TIM 232 into the lid 230, the structure has improved reliability because gold is not required to bond the indium to the lid, and therefore, there are no gold-containing intermetallic compounds (IMCs) between the indium TIM 232 and the lid 230. If used, gold-containing IMCs can crack during subsequent processing or during usage of the package.

In the embodiments where the back-side metal 212 includes gold, gold-containing IMCs can form between the back-side metal and the TIM 232. In these embodiments, the gold-containing IMCs can have a thickness in a range from 0.5 μm to 2 μm.

The lid 230 may be formed of a material with high thermal conductivity, such as a metal, such as copper, nickel, indium, steel, iron, or the like. In some embodiment, the lid 230 is formed of copper, nickel, and indium. The lid 230 protects the package component 210 and forms a thermal pathway to conduct heat from the various components of the package component 210 (e.g., the integrated circuit dies 50). The lid 230 is thermally coupled to the back-side surface of the package component 210, e.g., a back-side surface of the back-side metal 212, by the TIM 232. The lid 230 with integrated TIM 232 is attached to the package component 210 and the package substrate 220 by using a thermal clamping process such that the TIM 232 bonds or joins with the back-side metal 212 and/or the lid 230. In some embodiments, the process involves heating the structure while applying force to the lid 230 and/or the package substrate 220.

Other features and processes may also be included. For example, testing structures may be included to aid in the verification testing of the 3D packaging or wherein 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 12-17 are views of intermediate stages in the manufacturing of integrated circuit packages 200, in accordance with some other embodiments. This embodiment is similar to the embodiment described for FIGS. 1-11, except the flux layer 214 does not cover the back-side metal 212 but is formed over the underlying dies. The segmented formation of the flux 214 can cause the TIM 232 structure to have gaps or recesses outside of the area where the TIM 232 overlies a die. These gaps or recesses in the TIM 232 can reduce the stress and improve the reliability of the resulting integrated circuit packages 200.

Figure 12:
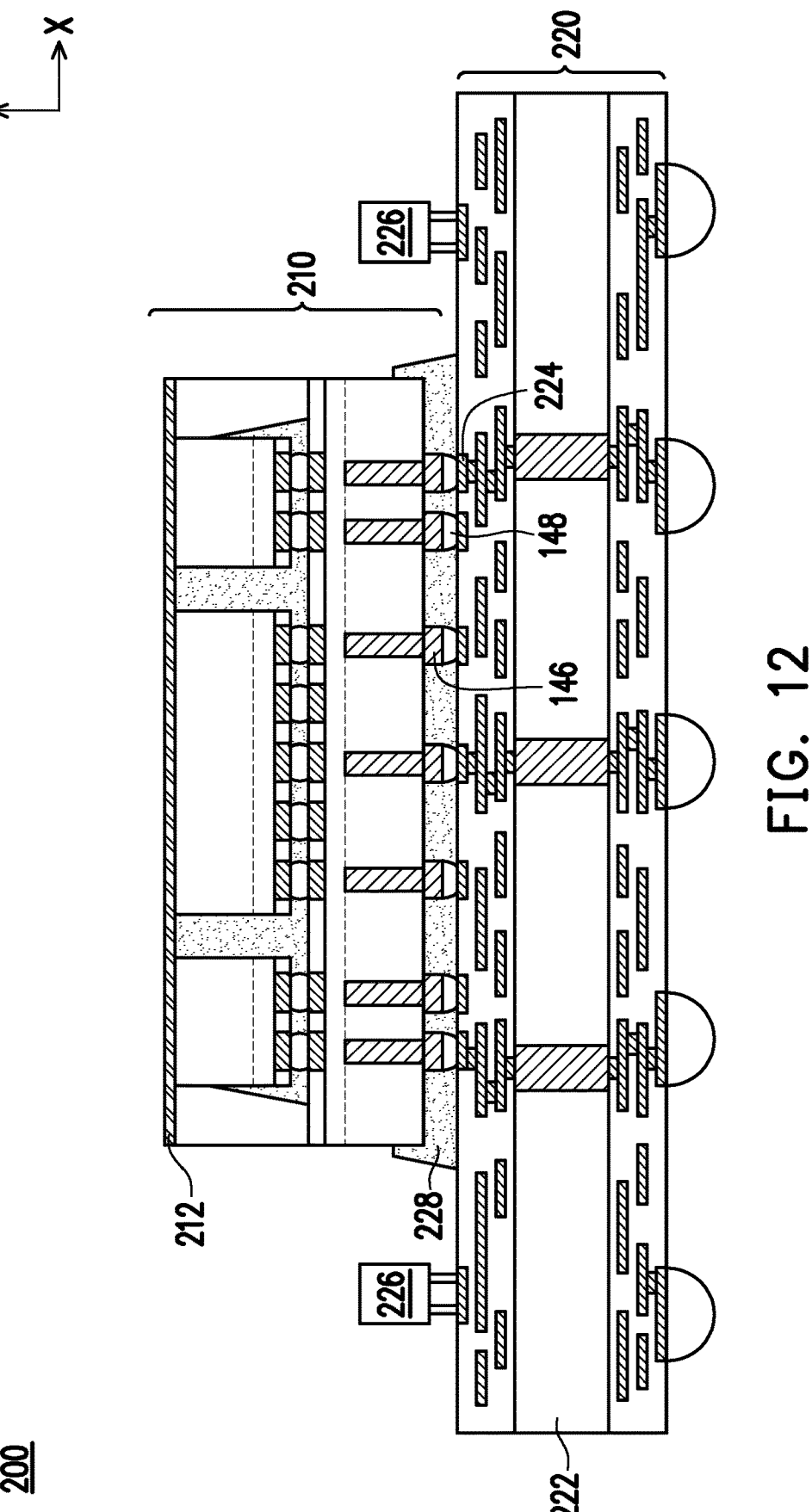
FIGS. 12, 13A, 13B, 14, 15, 16, and 17 are views of intermediate stages in the manufacturing of integrated circuit packages, in accordance with some embodiments.

In FIG. 12, the package component 210 is bonded to package substrate 220, in a similar manner as described for FIG. 8.

Figure 13A:
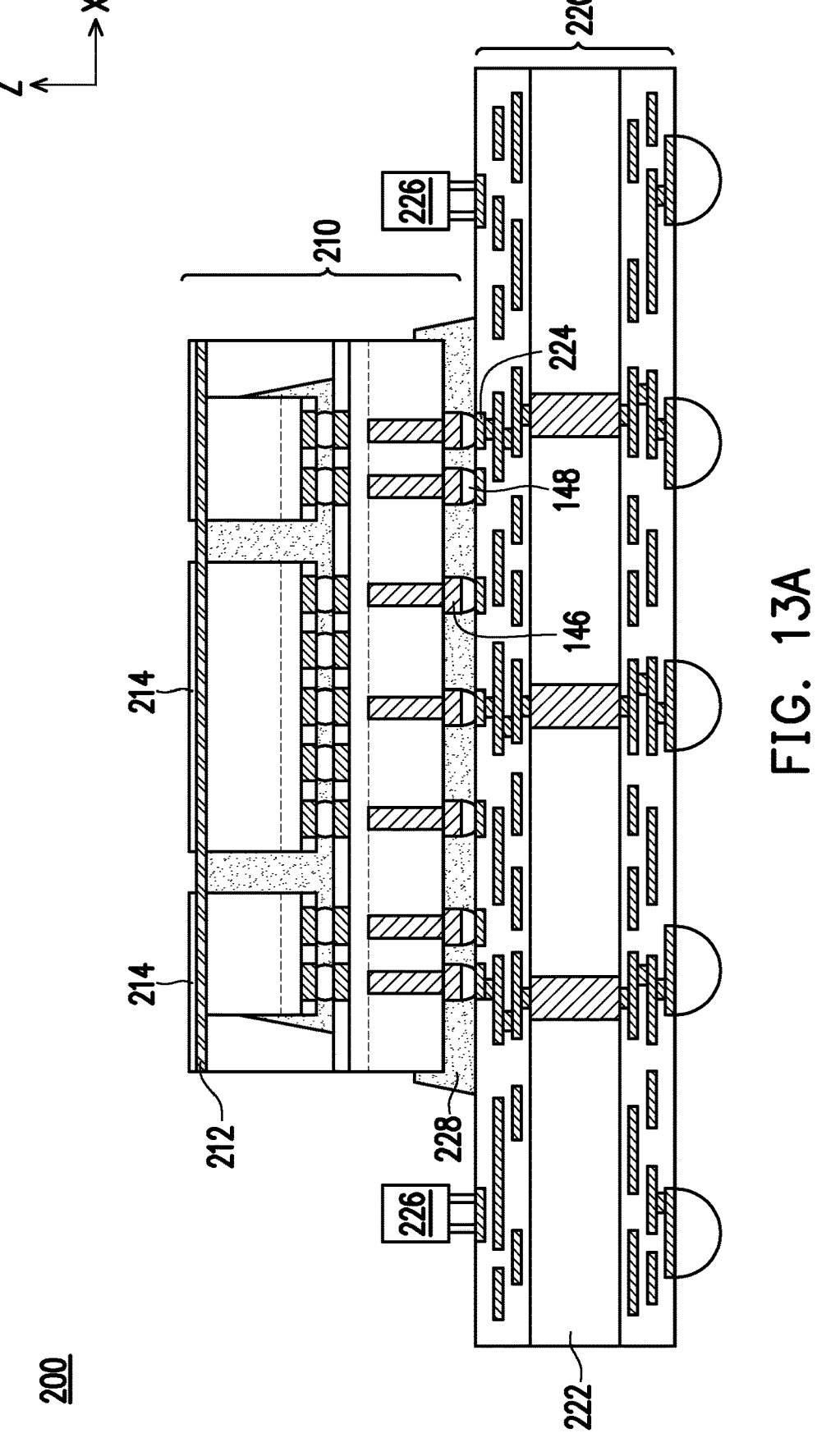
Figure 13B:
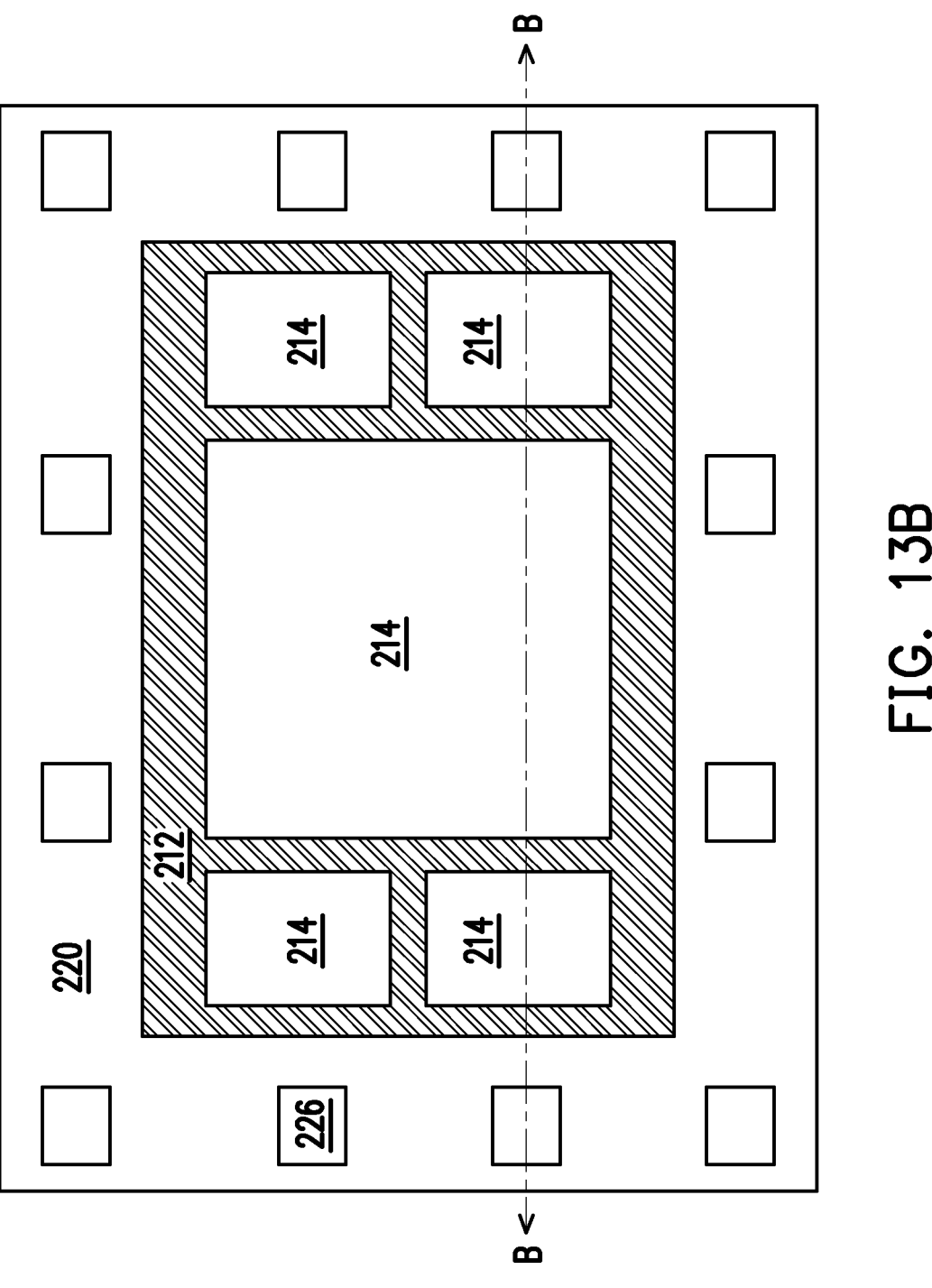

In FIGS. 13A and 13B, the back-side metal 212 is coated with the flux 214. In this embodiment, the flux 214 is formed to only be over the dies 50 of the package component 210 (within process variations). This process has the back-side metal 212 being exposed through the flux 214 in the spaces between the dies 50 of the package component 210.

Figure 14:
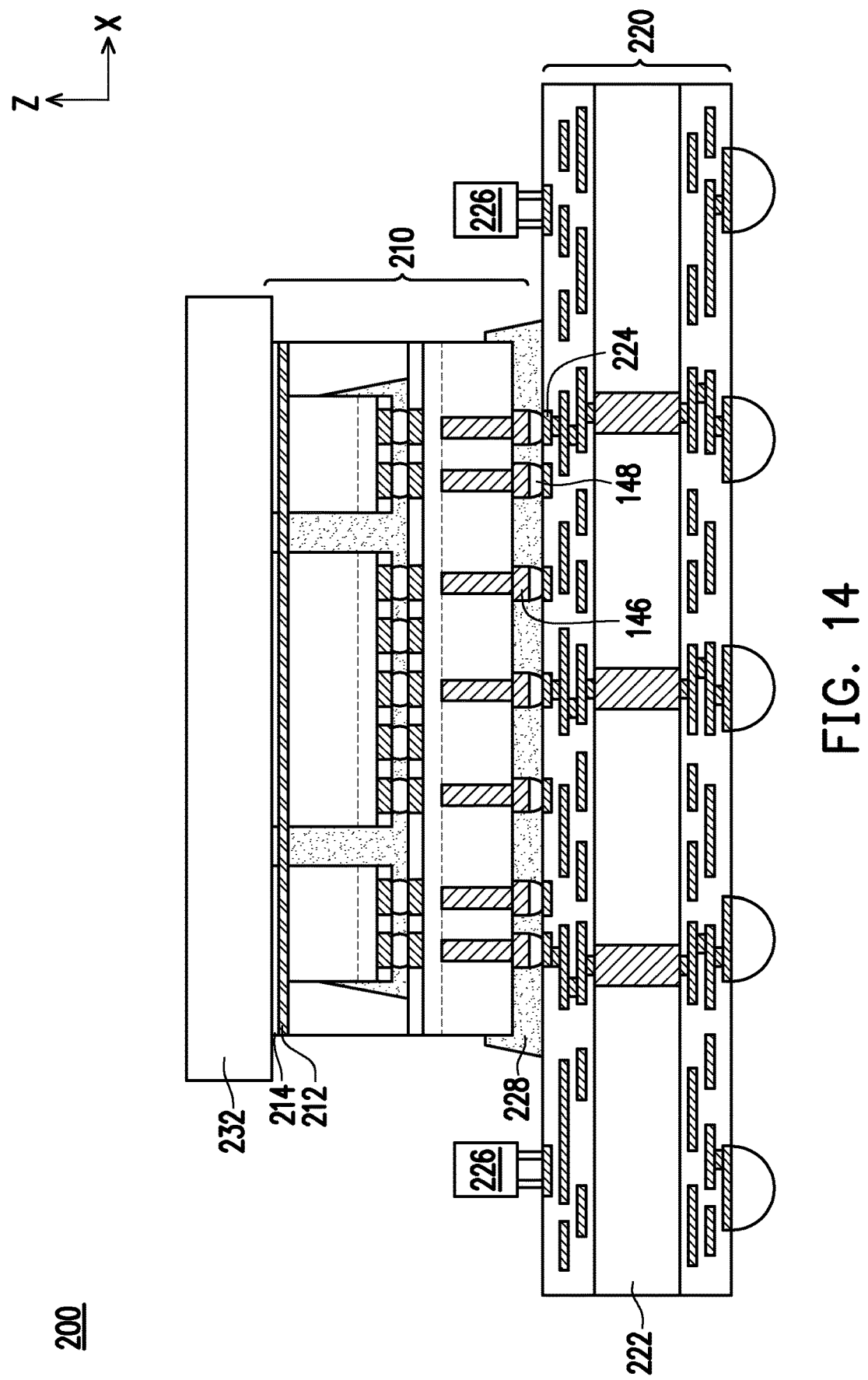

In FIG. 14, the TIM 232 is placed on the package component 210 using, e.g., a pick-and-place tool. In some embodiments, the TIM 232 is formed on a separate structure (e.g., a wafer or carrier) and then placed on the package component 210. The TIM 232 may be a similar material and size as described in the previous embodiment and the description is not repeated herein.

Figure 15:
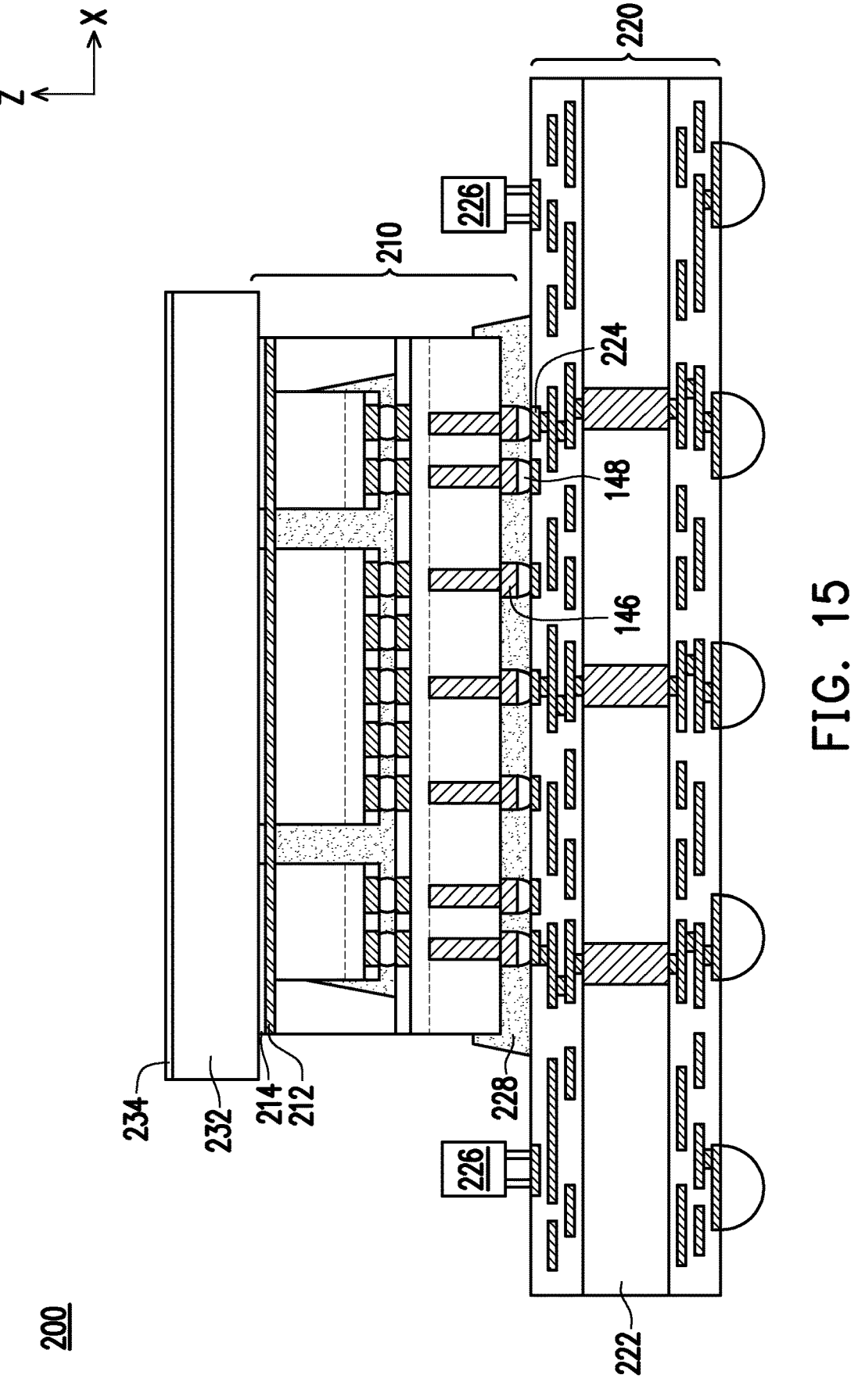
Figure 16:
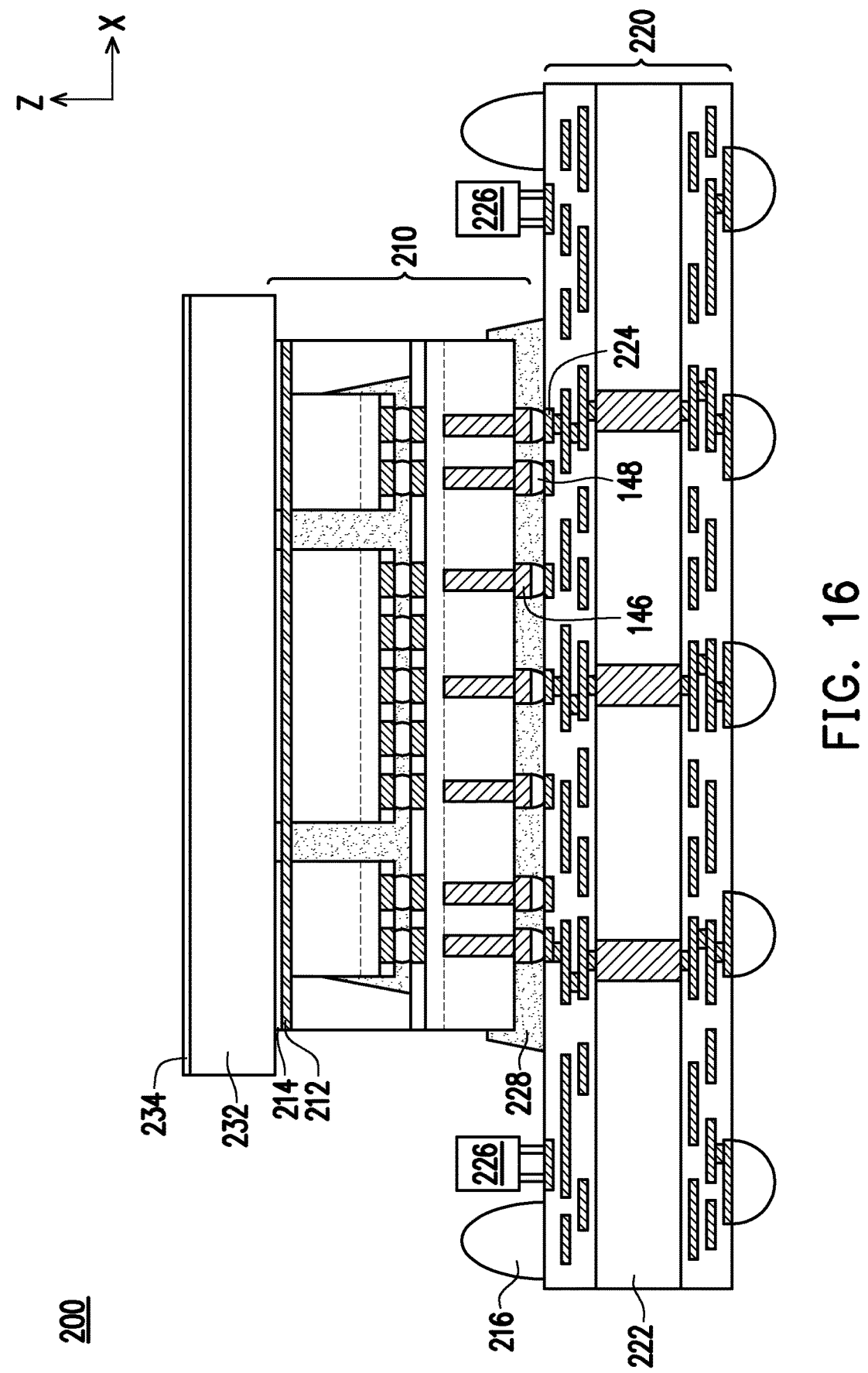

In FIG. 15, the adhesive 216 is formed on the package substrate 220 and a flux 234 is formed on the TIM 232. The adhesive 216 and the TIM 232 are used to subsequently adhere a lid 230 (see FIG. 17) to the package substrate 220 and the package component 210. The lid 230 may also be attached by other techniques.

Figure 17:
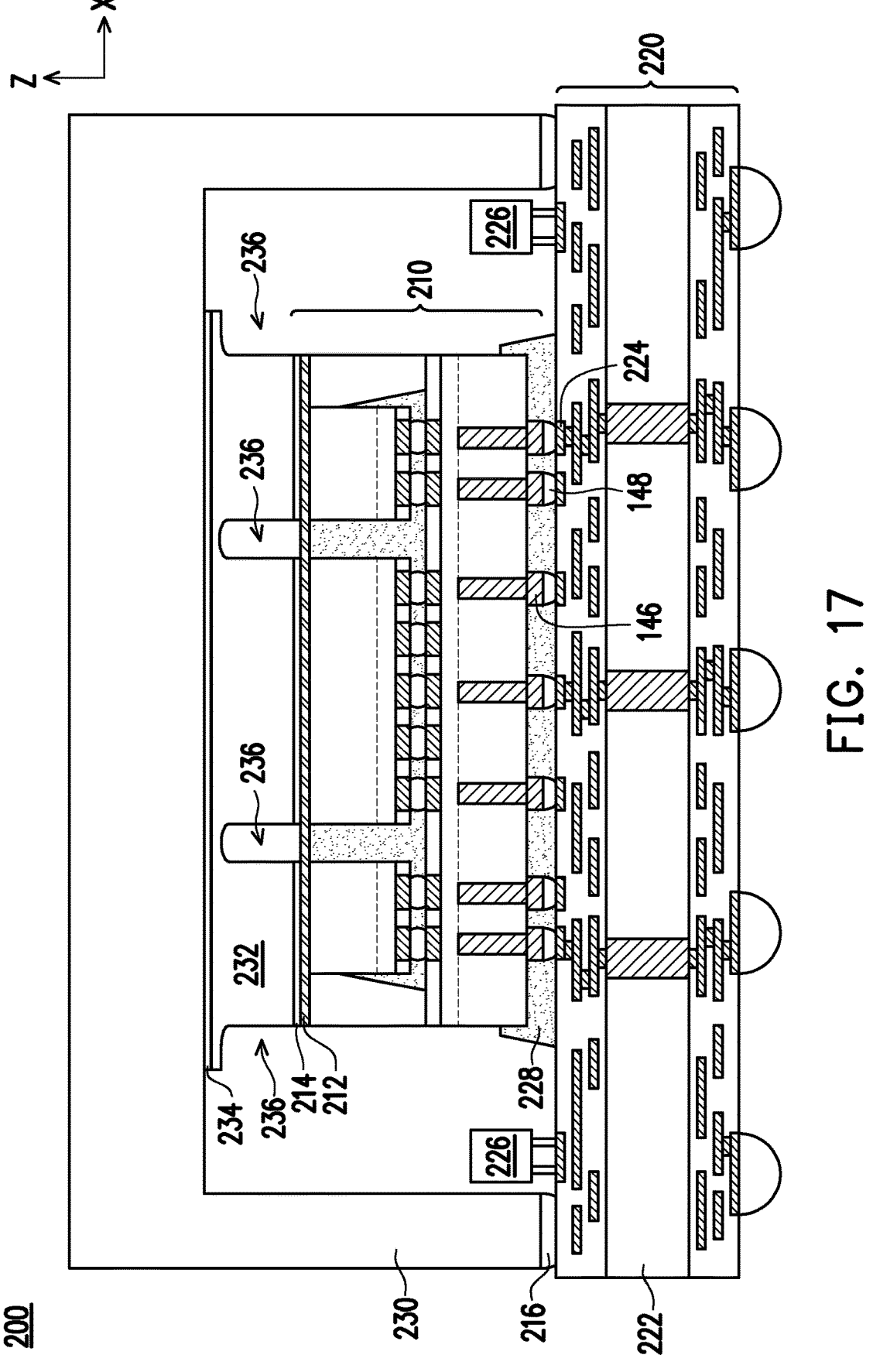

In FIG. 17, the lid 230 is attached to the TIM 232 and the package substrate 220. The lid 230 may be a similar material and size as described in the previous embodiment and the description is not repeated herein. The lid 230 is attached to the TIM 232 and the package substrate 220 by using a thermal clamping process such that the TIM 232 bonds or joins with the back-side metal 212 and/or the lid 230. As illustrated in FIG. 17, the gaps in the flux 214 on the back-side metal 212 causes corresponding gaps 236 to form in the TIM 232 during the thermal clamping process. In some embodiments, the thermal clamping process includes placing the structure in a chamber that is a temperature in a range from 100° C. to 260° C.

In the embodiments where the back-side metal 212 includes gold, gold-containing IMCs can form between the back-side metal and the TIM 232. In these embodiments, the gold-containing IMCs can have a thickness in a range from 0.5 μm to 2 μm.

By causing the TIM 232 structure to have gaps or recesses outside of the area where the TIM 232 overlies a die, the stress caused by the mismatch of coefficient of thermal expansion (CTE) between the TIM 232 and the package component 210 and package substrate 220 can be reduced. This reduction of stress in the package structure can improve the reliability of the resulting integrated circuit packages 200.

Embodiments may achieve advantages. In some embodiments, after the package components attached to the package substrates, lids with integrated heat dissipation structures are simultaneously attached to the package components and the package substrates. The integrated heat dissipation structure may be formed by a plating process on the lid and may comprise indium. By integrating an indium heat dissipation structure into the lid, the structure has improved reliability because there are no gold-containing intermetallic compounds (IMCs) between the indium heat dissipation structure and the lid. If used, gold-containing IMCs can crack during subsequent processing or during usage of the package. Further, in some embodiments, the indium heat dissipation structure is formed to have gaps or recesses outside of the area where the structure overlies an integrated circuit die. These gaps or recesses in the indium heat dissipation structure can reduce the stress in the packages and improve the reliability.

In an embodiment, a device includes a package component including an integrated circuit die and conductive connectors connected to the integrated circuit die, the conductive connectors disposed at a front-side of the package component. The device also includes a back-side metal layer on a back-side of the package component. The device also includes an indium thermal interface material on a back-side of the back-side metal layer. The device also includes a lid on a back-side of the indium thermal interface material. The device also includes a package substrate connected to the conductive connectors, the lid being adhered to the package substrate.

Embodiments may include one or more of the following features. The device where the indium thermal interface material is wider than the package component. The indium thermal interface material is thicker than the back-side metal layer. The back-side metal layer includes multiple metal layers. The back-side metal layer includes aluminum, titanium, titanium nitride, nickel, nickel vanadium, silver, gold, copper, or combinations thereof. The device further including an underfill between the package substrate and the package component. The package component is a chip-on-wafer package component. There are gaps in the indium thermal interface material. The back-side metal layer includes gold, a gold-containing intermetallic compound (IMC) being at an interface of back-side metal layer and the indium thermal interface material, an interface between the indium thermal interface material and the lid being free of a gold-containing IMC.

In an embodiment, a method includes packaging an integrated circuit die in a package region of a wafer. The method also includes depositing a back-side metal layer on a back-side of the integrated circuit die. The method also includes singulating the package region from the wafer to form a package component. The method also includes after singulating the package region, connecting the package component to a package substrate. The method also includes placing an indium thermal interface material on the back-side metal layer. The method also includes attaching a lid to the package substrate, the lid being coupled to the indium thermal interface material.

Embodiments may include one or more of the following features. The method further including dispensing a first flux on the indium thermal interface material, the first flux being between the indium thermal interface material and the lid. Attaching the lid to the package substrate further includes performing a thermal clamping process to adhere the lid to the package substrate and the indium thermal interface material. After performing the thermal clamping process, the indium thermal interface material has gaps. The method further including dispensing a second flux on a back-side of the package component, the second flux covering the back-side of the package component. The method further including dispensing a second flux on a back-side of the package component, the second flux only being on a back-side of the integrated circuit die of the package component. The method further including after connecting the package component to the package substrate and before placing the indium thermal interface material on the back-side metal layer, dispensing an adhesive layer on a top surface the package substrate, the adhesive layer adhering the lid to the package substrate.

In an embodiment, a method includes bonding a plurality of integrated circuit dies to a wafer in a package region of the wafer. The method also includes encapsulating the plurality of integrated circuit dies with a molding compound. The method also includes forming a back-side metal layer on the molding compound and back-sides of the plurality of integrated circuit dies. The method also includes singulating the package region from the wafer to form a package component. The method also includes bonding the package component to a package substrate. The method also includes depositing a first flux on back-sides of the integrated circuit dies of the bonded package component. The method also includes attaching a thermal interface material to the first flux, the thermal interface material including indium. The method also includes attaching a lid to the package substrate, the thermal interface material being coupled to the lid.

Embodiments may include one or more of the following features. The method further including before attaching the thermal interface material to the first flux and attaching a lid to the substrate, plating the thermal interface material on the lid. The method depositing the first flux on back-sides of the integrated circuit dies of the bonded package component includes depositing the first flux on back-sides of the integrated circuit dies and the molding compound to cover a back-side of the package component. The method further including performing a thermal clamping process to attach the lid to the package substrate and the thermal interface material, the thermal clamping process forming gaps in the thermal interface material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   packaging a first integrated circuit die and a second integrated circuit die in a package region of a wafer;
   depositing a back-side metal layer on back-sides of the first and second integrated circuit dies;
   singulating the package region from the wafer to form a package component;
   after singulating the package region, connecting the package component to a package substrate;
   dispensing a first flux on the back-side metal layer on a back-side of the package component, the first flux only being over a back-side of the first and second integrated circuit dies of the package component with a gap between sections of the first flux;
   placing an indium thermal interface material on the first flux; and
   attaching a lid to the package substrate, the lid being coupled to the indium thermal interface material.

2. The method of claim 1 further comprising:
   dispensing a second flux on the indium thermal interface material, the second flux being between the indium thermal interface material and the lid.

3. The method of claim 1, wherein attaching the lid to the package substrate further comprises:

performing a thermal clamping process to adhere the lid to the package substrate and the indium thermal interface material.

4. The method of claim 3, wherein after performing the thermal clamping process, the indium thermal interface material has gaps.

5. The method of claim 1, further comprising:
   after connecting the package component to the package substrate and before placing the indium thermal interface material on the back-side metal layer, dispensing an adhesive layer on a top surface of the package substrate, the adhesive layer adhering the lid to the package substrate.

6. The method of claim 1 further comprising:
   dispensing a second flux on the thermal interface material, the second flux being between the thermal interface material and the lid.

7. The method of claim 1, wherein the metal layer comprises gold, a gold-containing intermetallic compound (IMC) being at an interface of the metal layer and the indium thermal interface material, an interface between the indium thermal interface material and the lid being free of a gold-containing IMC.

8. The method of claim 1, wherein packaging the first integrated circuit die and the second integrated circuit die in the package region of the wafer comprises:
   bonding the first integrated circuit die and the second integrated circuit die to the wafer;
   forming a first underfill between the first integrated circuit die and the second integrated circuit die;
   encapsulating the first integrated circuit die and the second integrated circuit die and the underfill with a molding compound, the back-side metal layer being on the molding compound and the first integrated circuit die and the second integrated circuit die.

9. The method of claim 8 further comprising:
   forming a second underfill between the package component and the package substrate; and
   attaching passive devices to the package substrate adjacent to the package component, the lid surrounding the passive devices.

10. A method comprising:
   bonding a plurality of integrated circuit dies to a wafer in a package region of the wafer;
   encapsulating the plurality of integrated circuit dies with a molding compound;
   forming a back-side metal layer on the molding compound and back-sides of the plurality of integrated circuit dies;
   singulating the package region from the wafer to form a package component;
   bonding the package component to a package substrate;
   depositing a first flux on back-sides of the integrated circuit dies of the bonded package component;
   attaching a thermal interface material to the first flux, the thermal interface material comprising indium;
   attaching a lid to the package substrate, the thermal interface material being coupled to the lid; and
   performing a thermal clamping process to attach the lid to the package substrate and the thermal interface material, the thermal clamping process forming gaps in the thermal interface material, at least one of the gaps extending from the back-side metal layer through the first flux into the thermal interface material.

11. The method of claim 10 further comprising:

before attaching the thermal interface material to the first flux and attaching a lid to the package substrate, plating the thermal interface material on the lid.

12. A method comprising:

packaging a first integrated circuit die and a second integrated circuit die in a package region of a wafer;

depositing a metal layer on back-side of the first and second integrated circuit dies;

singulating the package region from the wafer to form a package component;

after singulating the package region, connecting the package component to a package substrate;

dispensing a first flux on a back-side of the package component, the first flux being on the metal layer of the package component, a first section of the first flux being over the first integrated circuit die, a second section of the first flux being over the second integrated circuit die, the first section being spaced apart from the second section;

placing an indium thermal interface material on the first flux; and attaching a lid to the package substrate, the lid being coupled to the indium thermal interface material.

13. The method of claim 12, wherein after attaching the lid to the package substrate, the indium thermal interface material has gaps in regions outside of where the indium thermal interface material overlies the integrated circuit die.

14. The method of claim 12, wherein attaching the lid to the package substrate further comprises:

performing a thermal clamping process to adhere the lid to the package substrate and the indium thermal interface material.

15. The method of claim 12 further comprising:

dispensing a second flux on the indium thermal interface material, the second flux being between the indium thermal interface material and the lid.

16. The method of claim 12, wherein the indium thermal interface material is wider than the package component.

17. The method of claim 12, wherein the indium thermal interface material is thicker than the metal layer.

18. The method of claim 12, wherein the metal layer comprises multiple metal layers.

19. The method of claim 12, wherein the metal layer comprises aluminum, titanium, titanium nitride, nickel, nickel vanadium, silver, gold, copper, or combinations thereof.

20. The method of claim 12, wherein the metal layer comprises gold, a gold-containing intermetallic compound (IMC) being at an interface of the metal layer and the indium thermal interface material, an interface between the indium thermal interface material and the lid being free of a gold-containing IMC.

* * * * *